US006570457B2

(12) United States Patent
Fischer

(10) Patent No.: US 6,570,457 B2
(45) Date of Patent: May 27, 2003

(54) PHASE LOCKED LOOP USING SAMPLE AND HOLD AFTER PHASE DETECTOR

(75) Inventor: Gerald R. Fischer, Playa Del Rey, CA (US)

(73) Assignee: Northrop Grumman Corporation, Los Angeles, CA (US)

(*) Notice: Subject to any disclaimer, the term of this patent is extended or adjusted under 35 U.S.C. 154(b) by 0 days.

(21) Appl. No.: 10/000,613

(22) Filed: Oct. 24, 2001

(65) Prior Publication Data

US 2003/0076176 A1 Apr. 24, 2003

(51) Int. Cl.[7] .............................. H03L 7/00; H03L 7/085
(52) U.S. Cl. .................. 331/17; 331/8; 331/14; 331/16; 327/156
(58) Field of Search ................... 331/8, 14, 16, 331/17, 18, 25; 327/156–159; 332/127; 360/51; 375/376; 455/260

(56) References Cited

U.S. PATENT DOCUMENTS 5,920,233 A  7/1999  Denny 6,223,061 B1 * 4/2001  Dacus et al. ................ 455/574

* cited by examiner

Primary Examiner—David C. Mis
(74) Attorney, Agent, or Firm—Harness, Dickey & Pierce, P.L.C.

(57) ABSTRACT

The present invention provides a phase locked loop (10) for generating a variable output frequency signal. The phase locked loop (10) includes a controlled oscillator (14) to generate the variable output frequency signal in response to a tune signal. A feedback frequency divider (16) coupled to the controlled oscillator (14) is operable to generate a divided frequency signal from the variable output frequency signal. A phase detector (18) generates an error signal representing a difference between a reference frequency signal and the divided frequency signal. A sample and hold circuit (22) is activable in response to a gating signal (20) derived from the reference frequency, to sample the error signal and generate a sampled signal. A loop filter (12) filters the sampled signal and generates the tune signal.

20 Claims, 3 Drawing Sheets

PHASE LOCKED LOOP USING SAMPLE AND HOLD AFTER PHASE DETECTOR

BACKGROUND OF THE INVENTION

1. Field of the Invention

The present invention relates generally to phase locked frequency synthesizers, and in particular to phase locked loops that suppress the leakage of spurious energy from the phase detector to the controlled oscillator.

2. Discussion of the Related Art

A phase locked loop (PLL) is a negative feedback system that maintains a constant phase and zero frequency difference between a variable frequency and a reference frequency. Conventional PLL's include a phase detector element to compare the frequency and phase of an oscillator to that of the reference frequency. The oscillator is then controlled to maintain the constant phase and frequency difference.

Often, it is desirable to design a PLL so that the PLL can be rapidly tuned from one lock point (or frequency) to another. This is accomplished through a "wide" PLL control system bandwidth. However, the "sampling" nature of the phase detector limits the PLL control system bandwidth and therefore tuning speed to substantially less than the sampling rate. Further, imperfections in the phase detector produce undesirable leakage of the phase detector sampling (reference) frequency into the forward path of the PLL control system. Filtering is generally employed to attenuate the impact of the leakage. The additional filtering causes an even greater reduction of PLL bandwidth below the sampling rate.

Still another problem occurs in PLLs having multiple bandwidths. In multi-bandwidth PLLs, a wide bandwidth is employed for PLL acquisition and a narrower bandwidth is switched to for tracking. The wide acquisition bandwidth improves acquisition speed, while the narrow tracking bandwidth provides increased tracking. accuracy. In such a design if additional filtering is used to attenuate leakage, it is necessary to use a switch(es) to alter the filtering time constant to accommodate the separate bandwidths. Physically realizable switches and the associated circuits suffer from a phenomenon, known as "charge injection", which introduces a disturbance into the other circuit elements at the time the switch is activated. Charge injection is also commonly referred to as "switch feedthrough" and generally occurs as the result of the switch control signal entering the signal path via parasitic capacitive coupling. The resulting effect is the injection of an amount of charge equal to the voltage change in the control signal times the size of the parasitic capacitor. The disturbance caused by charge injection may form a new limitation on the speed of the phase locked loop tuning because the disturbance must be resolved by the slower tracking bandwidth PLL control system.

SUMMARY OF THE INVENTION

The phase locked loop system and method provides a system and method for generating a variable output frequency signal. The phase locked loop includes a controlled oscillator to generate the variable output frequency signal in response to a tune signal. A feedback frequency divider coupled to the controlled oscillator is operable to generate a divided frequency signal from the variable output frequency signal. A phase detector that is driven by a reference frequency generates an error signal representing a difference between the reference frequency signal and the divided frequency signal. A sample and hold circuit is activable in response to a gating signal related to the reference frequency, to sample the error signal and generate a sampled signal. A loop filter filters the sampled signal and generates the tune signal.

For a more complete understanding of the invention, its objects and advantages, reference may be had to the following specification and to the accompanying drawings.

DETAILED DESCRIPTION OF THE PREFERRED EMBODIMENT

Figure 1:
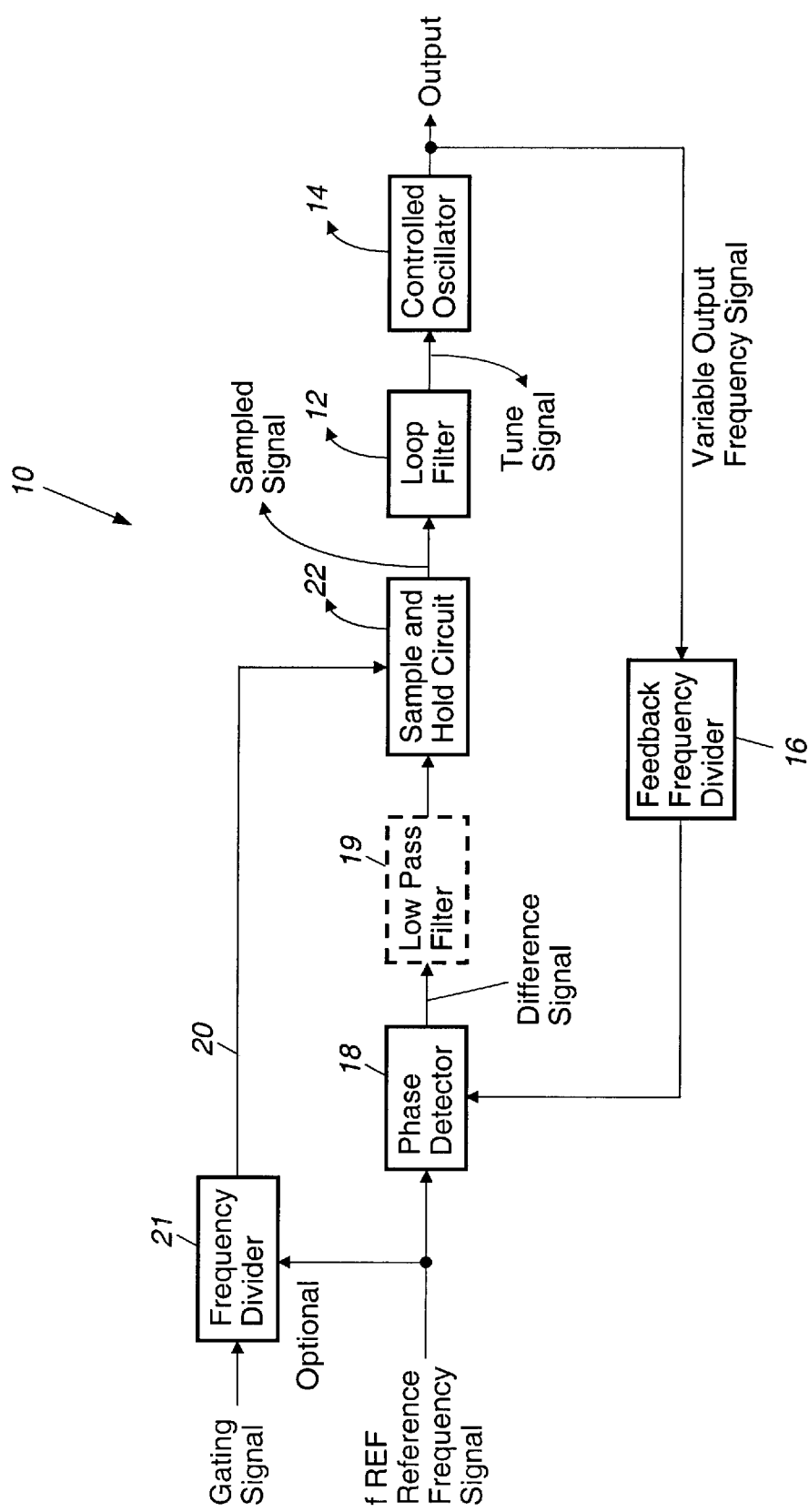
FIG. 1 illustrates a block diagram of a phase locked loop in accordance with the teachings of the invention.

Referring to FIG. 1, a phase locked loop 10 according to the present invention is shown. The PLL 10 includes a controlled oscillator 14 for generating an output frequency signal in response to a tuning signal. A feedback frequency divider 16 senses the output frequency signal and generates a divided frequency signal. A phase detector 18 compares the frequency and phase of the divided frequency signal to the frequency and phase of a reference frequency signal and generates an error signal to represent the difference between the reference frequency signal and the divided frequency signal. A gating signal 20 is produced from the reference frequency or, optionally, from a frequency divider 24 driven by the reference frequency. The frequency divider 24 is employed when the output of the phase detector contains AC leakage with frequency components that are subharmonics of the reference frequency as is the case when the PLL 10 is operated as a fractional-N frequency synthesizer in which the feedback divider divide ratio is periodically altered to generate a net fractional division ratio. In such cases the frequency of the gating signal 20 is set equal to the lowest subharmonic frequency present that is desired to be suppressed. The gating signal 20 drives a sample and hold circuit 22 in synchrony with the reference frequency so that the difference signal is sampled by the sample and hold circuit 22 at a stationary point with respect to the AC leakage waveform present in the phase detector output. A sampled signal associated with the sampled error signal is generated by the sample and hold circuit 22. The sampled signal is filtered by a filter 12 to attenuate injected noise and remove high frequency components from the tuning signal that is provided to the controlled oscillator 14.

The scope of the invention includes using several types of phase detector such as mixer-based phase detectors that generate a difference signal that comprises an AC component with a DC offset, wherein the DC offset indicates the amount of the phase difference and the frequency of the AC component is related to frequencies of the detected signals. The error signal is preferably directly coupled to the sample and hold circuit 22 which samples the error signal at a stationary point with respect to the AC component period. By sampling at approximately the same instant within each cycle, the AC component of the signal is removed, leaving the DC offset as the error signal. A low pass filter 19 may be inserted between the phase detector 18 and the sample and hold to attenuate the AC signal, thereby relaxing the requirement for sampling at approximately the same instant within each cycle.

Another well known phase detector generates a difference signal that is comprised of a series of pulses that correspond to the difference. The duration of an error signal pulse reflects the magnitude of the difference in the phases of the signals. A low pass filter 19 attenuates the high frequency components and generates an error signal that is coupled to the sample and hold circuit 22. The low pass filter 19 may provide attenuation of the difference signal at the gating frequency ranging from 1 db up to 20 db or more. Providing less attenuation increases the requirement for a consistent sampling instant on a per cycle basis, but provides faster system response times.

Figure 2:
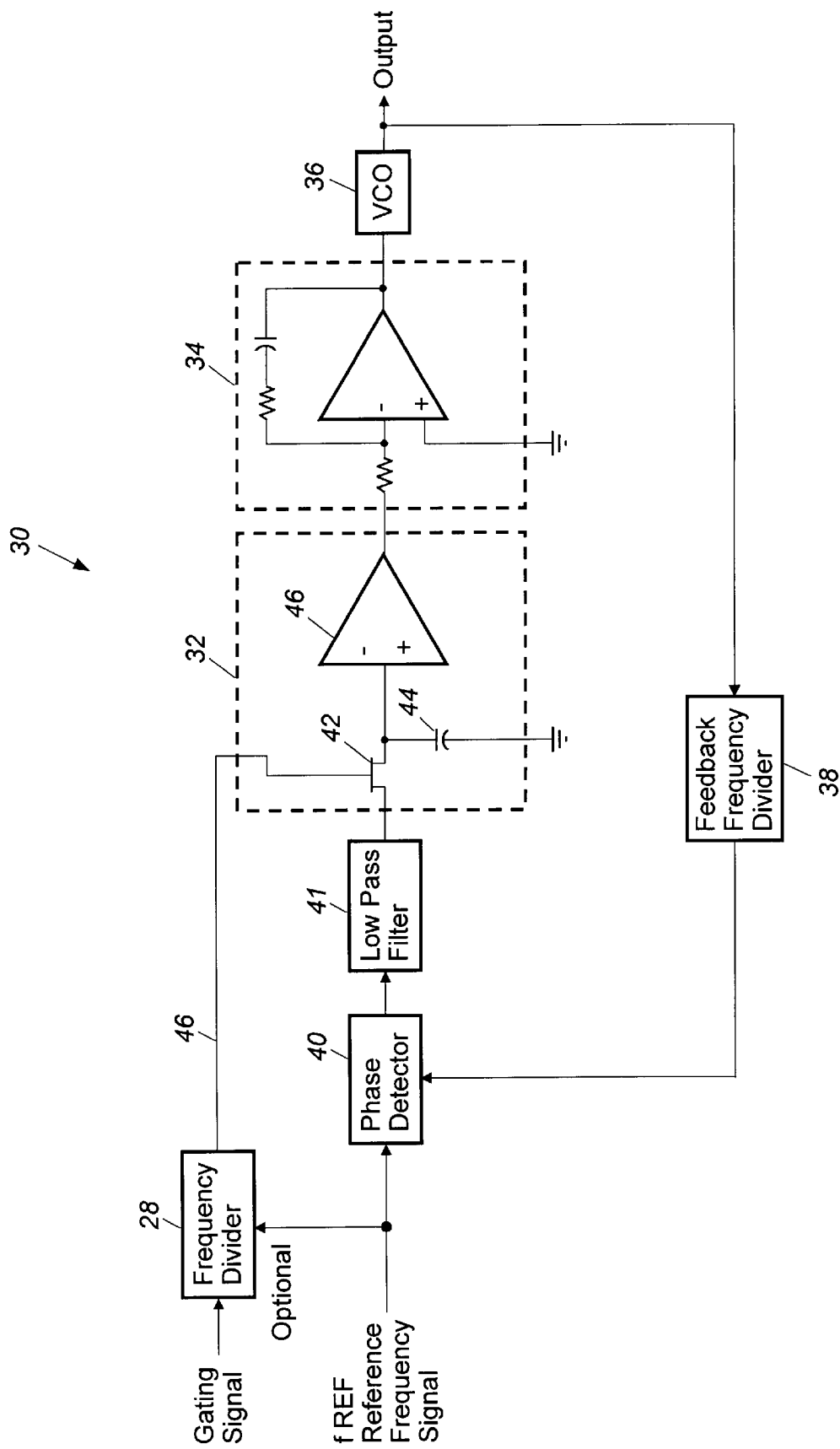
FIG. 2 illustrates a circuit diagram of an embodiment of a phase locked loop in accordance with the teachings of the invention.

Referring to FIG. 2, a schematic of a preferred embodiment of a phase locked loop 30 in accordance with the teachings of the invention is illustrated. The phase locked loop 30 includes an optional frequency divider 28, sample and hold circuit 32, loop filter 34, voltage controlled oscillator 36, frequency divider 38, and phase detector 40.

The sample and hold circuit 32 includes a sampling switch 42 coupled to the phase detector 40 to control the sampling of the error signal pulses that are generated by the phase detector 40. The operation of the sampling switch 42 is controlled by a gating signal derived from the reference frequency of the phase detector 40. The sampling switch 42 is preferably a field effect transistor (FET), however the scope of the invention includes using other controllable devices such as bipolar junction transistors. A hold capacitor 44 stores the voltage level of the sampled error pulse preferably until another gating pulse is received. The scope of the invention includes other forms of sample and hold circuits including those which have two sampling switch and hold capacitor combinations in sequence with gating pulses staggered in time such that the output of the sample and hold is never directly connected to the input. Such a sample and hold prevents feedthrough of the AC components in the phase detector output during the brief gating pulse duration. The sampled error signal is preferably buffered by a voltage buffer 46. However, the scope of the invention does not require the sampled error signal to be buffered. Although the preferable voltage buffer 46 is a unity gain non-inverting amplifier, using other buffers is envisioned such as non-unity gain amplifiers, and voltage buffer configured FETs and BJTs. The sampled signal is coupled from the buffer 46 to the loop filter 34 which filters the sampled signal and provides the tuning signal to the voltage controlled oscillator 36. The loop filter 34 is preferably an amplifier configured as an integral plus proportional loop filter, however, the scope of the invention includes other low pass filters such as passive networks and controlled bandwidth configurations having switches to control the bandwidth of the filter. A possible controlled bandwidth configuration includes switching the loop filter bandwidth to wide bandwidth during an acquisition phase and to narrow bandwidth during a tracking phase of the phase locked loop 30. The loop filter bandwidth may be controlled by switches that are in series or shunt with other resistors/capacitors of the loop filter 34.

Figure 3:
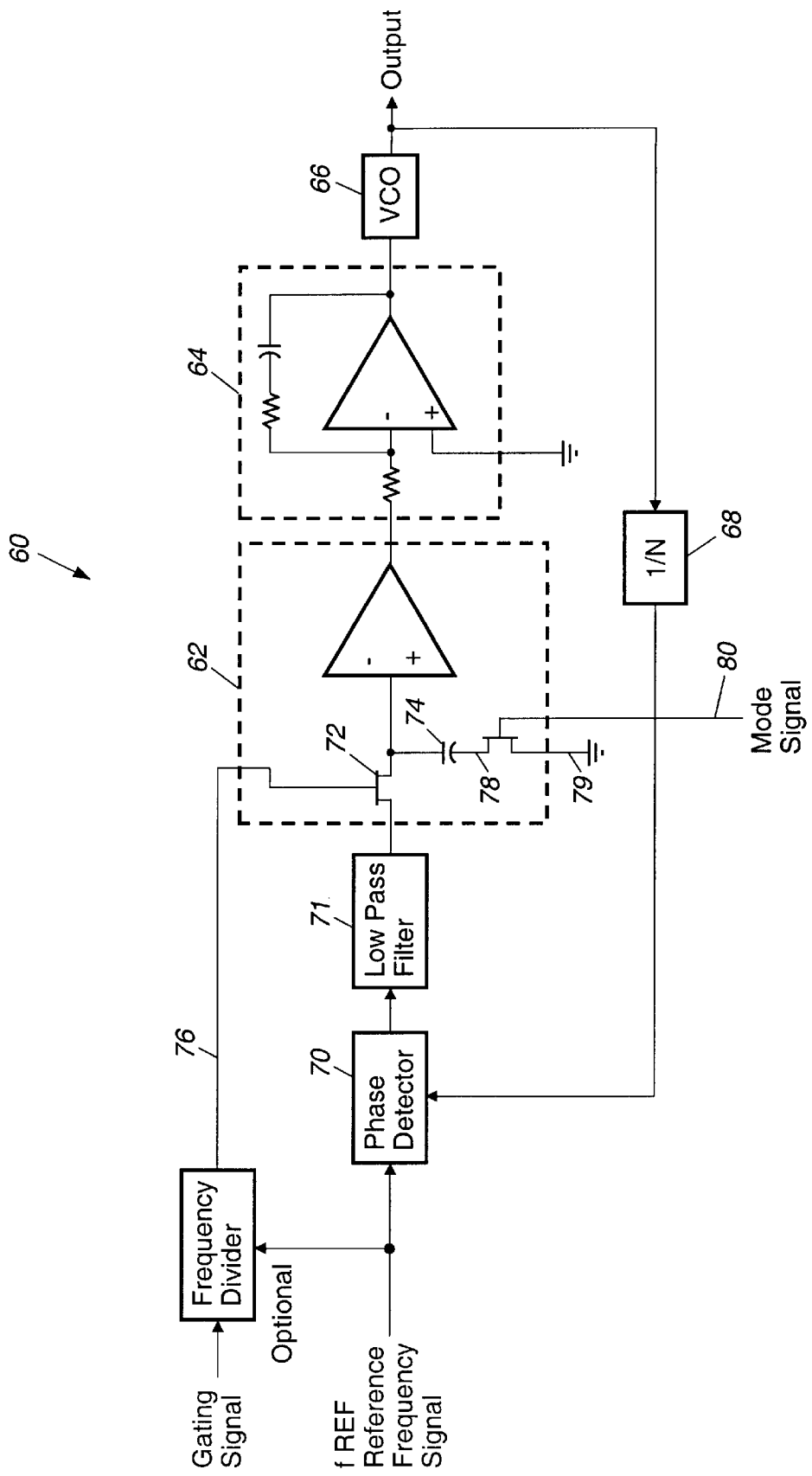
FIG. 3 illustrates a circuit diagram of a preferred embodiment of a phase locked loop in accordance with the teachings of the invention.

Referring to FIG. 3, an alternative embodiment of a phase locked loop 60 in accordance with the principles of the present invention is illustrated. Phase locked loop 60 is similar to phase locked loop 30 in function with corresponding elements in the range of 61 to 76, except that the phase locked loop 60 further includes a decoupling switch 78 to control the input impedance of the sample and hold circuit 62. The decoupling switch 78 is connected in series with the hold capacitor 74 and a circuit reference voltage 79 such as ground. In response to an operating mode signal 80, the decoupling switch 78 switches the hold capacitor 74 either into or out of the sample and hold circuit 62. For example, during signal acquisition the phase locked loop 60 is operated in a wide bandwidth mode to enhance acquisition speed. While in wide bandwidth mode, the decoupling switch 78 is set in the open state to open the path from the hold capacitor 74 to the circuit reference voltage 79. By decoupling the hold capacitor 74 from the sample and hold circuit 62, the lag introduced by the combination of the hold capacitor 74 and parasitic resistance of the sampling switch 72 is eliminated, thereby improving the acquisition speed. During signal tracking, the phase locked loop is operated in a narrow bandwidth mode to enhance signal tracking accuracy. While in narrow bandwidth mode, the decoupling switch 78 is set in the closed state to short the path from the hold capacitor 74 to the circuit reference voltage 79, thereby gaining the advantages described with reference to the embodiments of the phase locked loop described above and illustrated in FIGS. 1 and 2.

Thus it will be appreciated from the above that as a result of the present invention a system and method for generating a variable frequency output signal is provided by which the principal objectives, among others, are completely fulfilled. It will be equally apparent and is contemplated that modification and/or changes may be made in the illustrated embodiment without departure from the invention. Accordingly, it is expressly intended that the foregoing description and accompanying drawings are illustrative of preferred embodiments only, not limiting, and that the true spirit and scope of the present invention will be determined by reference to the appended claims and their legal equivalent.

What is claimed is:

1. A phase locked loop comprising:
   a controlled oscillator for generating a variable output frequency signal in response to a tune signal;
   a feedback frequency divider coupled to the controlled oscillator, for generating a divided frequency signal from the variable output frequency signal;
   a source of a reference frequency signal and a gating signal derived from the reference frequency;
   a phase detector for generating an error signal representing a difference between the reference frequency signal and the divided frequency signal;
   a sample and hold circuit activated in response to the gating signal, for sampling the error signal and generate a sampled signal; and
   a loop filter to filter the sampled signal and generate the tune signal.

2. The phase locked loop of claim 1 wherein the difference signal includes a series of pulses to represent the difference; and
   a low pass filter is coupled between the phase detector and the sample and hold circuit, the low pass filter generates an error signal in which difference signal high frequency components are attenuated.

3. The phase locked loop of claim 2 wherein the sample and hold circuit includes a sampling switch and a hold capacitor, the phase detector has a difference signal pulse frequency and wherein the low pass filter provides at least 1 db of attenuation at the difference signal pulse frequency.

4. The phase locked loop of claim 3 wherein the sampling switch, in response to the gating signal, controls the application of the error signal to the hold capacitor.

5. The phase locked loop of claim 4 wherein the sampling switch is activated a predetermined sampling delay after the difference signal pulse is active.

6. The phase locked loop of claim 2 wherein the sample and hold circuit, in response to a bandwidth mode signal, disables the sampling action and instead passes the error signal with little bandwidth reduction.

7. The phase locked loop of claim 3 wherein the sample and hold circuit further includes a decoupling switch coupled in series with the hold capacitor and a ground reference, the decoupling switch, in response to a bandwidth mode signal, to control a path from the hold capacitor to the ground reference, whereby during a wide bandwidth mode the path is opened so that loop bandwidth is not limited by the hold capacitor.

8. The phase locked loop of claim 2 wherein the loop filter is an active integral plus proportional loop filter.

9. The phase locked loop of claim 1 wherein the phase detector includes a mixer; and the error signal includes a high frequency AC component and a low frequency component that represents the phase difference.

10. The phase locked loop of claim 9 further comprising a low pass filter coupled between the phase detector and the sample and hold circuit to attenuate the high frequency AC component of the error signal.

11. A phase locked loop comprising:

means for generating a variable output frequency signal corresponding to a tune signal;

means for frequency dividing the variable output frequency signal such that a divided frequency signal is generated;

means for detecting a difference between a reference frequency signal and the divided frequency signal;

means for generating an error signal representing the difference, the error signal including a series of pulses to represent the difference;

means for sampling, in response to a gating signal, the error signal and generating a sampled signal; and a loop filter to filter the sampled signal and generate the tune signal.

12. The phase locked loop of claim 11 wherein the sampling means further includes a means for controlling to select a bandwidth mode of the phase locked loop.

13. The phase locked loop of claim 12 wherein the bandwidth mode is selected from the group of wide bandwidth and narrow bandwidth.

14. The phase locked loop of claim 11 wherein the sampling means includes a means for buffering the sampled signal.

15. The phase locked loop of claim 11 wherein the loop filter is an active integral plus proportional type filter.

16. A method of generating a controlled frequency signal, comprising:

generating a variable output frequency signal in response to a tune signal;

frequency dividing the variable output frequency signal so that a divided frequency signal is generated;

detecting a difference between a reference frequency signal and the divided frequency signal;

generating an error signal representing the difference, the error signal including a series of pulses to represent the difference;

in response to a gating signal, sampling the error signal and generating a sampled signal having a voltage level; and filtering the sampled signal so that the tune signal is generated.

17. The method of claim 16 further comprising:

holding the sampled signal voltage level constant until a next gating signal.

18. The method of claim 16 further comprising:

selecting an operating mode of the phase locked loop, the operating mode being selected from the group of wide bandwidth mode and narrow bandwidth mode; and during narrow bandwidth mode;

holding the sampled signal voltage level constant until a next gating signal; and during wide bandwidth mode;

the sampled signal being a series of pulses substantially equal to the error signal.

19. The method of claim 16 further comprising:

buffering the sampled signal.

20. The method of claim 16 wherein the step of filtering includes integrating the sampled signal in an integral plus proportional loop filter.

* * * * *